United States Patent [19]

Schomberg

[11] Patent Number: 5,604,434
[45] Date of Patent: Feb. 18, 1997

[54] MR METHOD

[75] Inventor: Hermann Schomberg, Hamburg, Germany

[73] Assignee: U.S. Philips Corporation, New York, N.Y.

[21] Appl. No.: 510,155

[22] Filed: Aug. 2, 1995

[30] Foreign Application Priority Data

Aug. 3, 1994 [DE] Germany .................. 44 27 430.0

[51] Int. Cl.$^6$ ................................ G01V 3/00
[52] U.S. Cl. ........................ 324/309; 324/307
[58] Field of Search ................ 324/300, 306, 324/307, 309, 314

[56] References Cited

U.S. PATENT DOCUMENTS

| | | | |
|---|---|---|---|
| 5,122,747 | 6/1992 | Riederer et al. | 324/309 |
| 5,402,067 | 3/1995 | Pauly et al. | 324/307 |
| 5,485,086 | 1/1996 | Meyer et al. | 324/307 |

FOREIGN PATENT DOCUMENTS 0256779  2/1988  European Pat. Off. ....... G01N 24/08

OTHER PUBLICATIONS

"High Speed Spiral-Scan Echo Planar NMR Imaging-I", by B. Ahn et al, IEEE Transactions on Medical Imaging, vol. MI-5, No. 1, pp. 2–7, 1986.

"The k–trajectory formulation of the NMR imaging process with applications in analysis and synthesis of imaging methods", by Twieg, Med. Physs. 10 (5), Sep./Oct. 1983. pp. 610–621.

"Partial K-space Reconstruction for Spiral-Acquisition Imaging", Supplement to JMRI, vol. 2(P), p. 25, 1992.

"A Fast Sinc Function Gridding Algorithm for Fourier Inversion in Computer Tomography", by J. D. O'Sullivan, IEEE Transactions on Medical Imaging, vol. MI–4, No. 4, pp. 200–207, 1985.

Primary Examiner—Louis M. Arana
Attorney, Agent, or Firm—Jack D. Slobod

[57] ABSTRACT

An MR method for determining the spatial distribution of the nuclear magnetization in an examination region, includes exciting the nuclear magnetization in the examination region, one or more times by means of at least one RF pulse in the presence of a steady, uniform magnetic field and reading the MR signals arising after the excitation in order to produce MR data, magnetic gradient fields acting on the examination region during the reading. These magnetic gradient fields are varied in such a manner that the MR signals in the spatial frequency domain are acquired along one or more spirals, the density of the spirals or their turns in the central part of the spatial frequency domain, corresponding to the low spatial frequencies, being greater than that in the remainder of the spatial frequency domain, the spirals in the remainder of the spatial frequency domain covering, together with their mirror-images, the remainder with a density which suffices for the reconstruction, and a nuclear magnetization distribution for the examination region is reconstructed from the MR data.

10 Claims, 3 Drawing Sheets

MR METHOD

BACKGROUND OF THE INVENTION

1. Field of the Invention

The invention relates to an MR method for determining the nuclear magnetization of an examination region, in which the MR signals are acquired along spiral-like trajectories in the spatial frequency domain (spiral-MRI).

2. Description of the Related Art

The invention also relates to a method in which the number of MR data to be measured can be reduced without loss of spatial resolution. As is described in the publication "The k-trajectory formulation of the NMR imaging process . . .", by Twieg, Med. Phys. 10 (5), September/October 1983, pp. 610–621, an MR signal is acquired in the spatial frequency domain or in the so-called k-domain or k-space along a trajectory which is dependent on the temporal variation of the magnetic gradient field activated, after the excitation of the nuclear magnetization in the examination region by one or more RF pulses, until and during the acquisition of the MR signal. The k-domain is a two-dimensional or three-dimensional domain, depending on whether a two-dimensional or a three-dimensional MR examination method is used. The acquisition of the MR signal along spiral-like trajectories offers the advantage of a comparatively fast acquisition of the MR data required for the reconstruction of the nuclear magnetization distribution.

EP-OS 256 779 describes an MR method in which the MR signals are scanned along a spiral-like trajectory in the spatial frequency domain. A problem is encountered in that, because of different relaxation times $T_2$, the higher spatial frequencies, which correspond to the outer region of the k-domain, are acquired in a different manner, depending on the type of tissue. In order to avoid this problem, redundant scanning takes place in the k-domain during which the spiral-like trajectory is scanned again in the opposite direction or a spiral-like trajectory which has been offset by half the width of one turn is followed in the opposite direction. Such redundant scanning prolongs the examination time and increases the number of MR data to be measured.

The article "High Speed Spiral-Scan Echo Planar NMR imaging-I", by B. Ahn et al., IEEE Transactions on Medical Imaging, Vol. MI-5, No. 1, pp. 2–7, 1986 described a method in which the MR signal in the k-domain is scanned along a spiral whose turns have a distance from one another which amounts to twice the value actually required for the examination of an examination region of a predetermined size and spatial resolution; the measuring time is thus reduced. The missing MR data are derived in the form of MR auxiliary data for auxiliary points in the spatial frequency domain which are situated between neighboring turns of the spiral. The determination of the MR auxiliary data takes into account the MR data measured at points on the spiral which are situated symmetrically to the auxiliary points with respect to the origin point of the spatial frequency domain. However, this method can produce perfect results only if the phase of the MR data is zero. In practice, however, this condition is usually not satisfied. The phase may even exhibit a slight dependency on location.

SUMMARY OF THE INVENTION

It is an object of the present invention to provide an MR method in which the MR signals in the spatial frequency domain are read along at least one spiral-like trajectory, in which only a part of the MR data required for the reconstruction is measured, and which achieves perfect reconstruction even when the measured MR data exhibit a phase. This objective is achieved in accordance with the invention by taking the following steps:

a) exciting the nuclear magnetization in the examination region at least once by means of at least one RF pulse in the presence of a steady, uniform magnetic field;

b) reading the MR signals arising after the excitation in order to produce MR data, with magnetic gradient field acting on the examination region during the reading;

c) varying this magnetic gradient field in such a manner that the MR signals in the spatial frequency domain are acquired along at least one spiral, the density of the spirals or their turns in the central part of the spatial frequency domain, corresponding to the low spatial frequencies, being greater than that in the remainder of the spatial frequency domain, the spirals in the remainder of the spatial frequency domain covering, together with their mirror images, the remainder with a density which suffices for the reconstruction; and d) reconstructing the nuclear magnetization distribution for the examination region from the MR data.

The invention is based on the following considerations: in spiral-MRI the size of the spatial frequency domain covered by one or more spirals is predetermined by the spatial resolution required. For a predetermined size of the region in which the nuclear magnetization distribution is to be determined, the distance between the spirals or the distance between individual turns of a spiral is then also predetermined. The invention is based on the recognition of the fact that the density of the spirals or the spiral turns in the spiral pattern thus imposed can be halved outside the central part of the spatial frequency domain in such a manner that the spiral (spirals) produces (produce) exactly said spiral pattern in conjunction with their mirror images.

A mirror image of a spiral is to be understood as a curve of whose points all are situated in a mirrored fashion with respect to the points of this spiral, mirrored being understood as two points which are situated at the same distance from the origin of the spatial frequency domain and which can be interconnected by means of a straight line passing through the origin.

When the halved number of spirals, together with their mirror images, corresponds to the said spiral pattern, the nuclear magnetization distribution can be reconstructed with full resolution, despite the reduced number of spirals and the correspondingly reduced number of MR data measured on the spirals. However, the signal- to-noise ratio is then also reduced.

While density of the spirals or their spiral turns has thus been reduced in comparison with the spiral pattern required for a complete reconstruction, this is not the case in the central part of the spatial frequency domain. Utilizing the fact that the phase of the nuclear magnetization distribution generally depends only weakly on the location, a complete reconstruction of the nuclear magnetization distribution can still be achieved.

It is to be noted that a publication by S. Tadjudin et al. "Partial K-Space Reconstruction for Spiral-Acquisition Imaging", Supplement to JMRI, Vol. 2 (P), p. 25, 1992, discloses a method in which the distance between the spirals for the high spatial frequencies is increased by omitting every other spiral line. The low-frequency domain at the center, however, is adequately scanned still. The MR data missing in the high spatial frequency domain are derived from the conjugate complex data measured for the mirrored spatial frequency. However, the publication does not provide any further information in this respect.

In a first further embodiment of the invention, the excitation of the nuclear magnetization and the reading of the MR signals are repeated p/2 times, p being an even number, and that the temporal variation of the magnetic gradient field is varied from one repetition to another in such a manner that a) p equal spirals are obtained with starting angles offset 360°/p relative to one another, said spirals extending from the edge of the central part of the spatial frequency domain to its center, b) a group of p/2 spirals, chosen in such a manner that the difference between the starting angles of two spirals of this group always deviates from 180°, extends beyond the edge of the central part, c) after an excitation, a spiral of this group and a spiral whose starting angle has been offset 180° with respect thereto are traversed.

Because after excitation of the nuclear magnetization by one or more RF pulses in the central part of the spatial frequency domain first a spiral arm and subsequently the corresponding mirrored spiral which extends beyond the central part, are traversed in this (or the reverse) order, only p/2 excitations are required so that the time required for acquiring the MR data is halved.

In a further embodiment of the invention, the magnetic gradient fields are varied in such a manner that the spirals thus arising in the spatial frequency domain extend beyond the central part, their slope outside the central part amounting to twice the slope inside the central part. Contrary to the previous embodiment, the number of spirals in the central part of the spatial frequency domain is not larger than that in the remainder of the spatial frequency domain; however, the distance between neighboring spirals or neighboring spiral turns in the central part amounts to only half the distance outside the central part, because they have only half the slope (i.e. the increase of the distance from the origin per turn).

According to a further embodiment of the invention, the spiral (spirals) is (are) always scanned by way of several successive excitation and read cycles. As a result, the spiral (spirals) is (are) divided into a plurality of segments so that the detrimental effect of the inhomogeneity of the magnetic field is uniformly distributed across the spatial frequency domain scanned.

The invention is not only suitable for determining the nuclear magnetization distribution in a two-dimensional, notably plane region, but also for the determination of a three-dimensional nuclear magnetization distribution. This implies that the MR signals are acquired in a three-dimensional spatial frequency domain. This domain can be filled by a number of slices or planes which extend parallel to one another or which intersect one another in a straight line passing through the origin of the spatial frequency domain, each of said slices or planes containing one or more spirals, or it can be filled by a family of coaxial, conical surfaces with different apex angles, whose vertices are situated at the origin of the k-domain and on each of which one or more spirals are situated. Thus, the term "spiral" is not to be understood to mean exclusively plane, two-dimensional curves.

An MR device for carrying out the method in accordance with the invention comprises:

a) a magnet for generating a steady, uniform magnetic field in the examination region, b) an RF coil system for transmitting magnetic RF pulses or for receiving MR, signals, c) gradient coil systems for generating magnetic gradient field which extend in the direction of the steady, uniform magnetic field and which comprise gradients extending in three mutually perpendicular directions, d) a receiver for converting the MR signals into a series of digital MR dam, e) a reconstruction unit for reconstructing the nuclear magnetization distribution in the examination region from the MR data, f) a control unit for controlling the units a) to e) which control unit controls the temporal variation of the currents through the gradient coil systems in such a manner that the MR signals in the spatial frequency domain are acquired along at least one spiral, the density of the spirals, or their turns, in the central part of the spatial frequency domain corresponding to the low spatial frequencies, amounting to at least having a density which amounts to at least twice the density in the remainder of the spatial frequency domain, the spirals in the remainder of the spatial frequency domain covering, in conjunction with their minor images, the remainder with a density which suffices for the reconstruction.

BRIEF DESCRIPTION OF THE DRAWINGS

The invention will be described in detail hereinafter with reference to the drawings. Therein.

DESCRIPTION OF THE PREFERRED EMBODIMENTS

Figure 1:
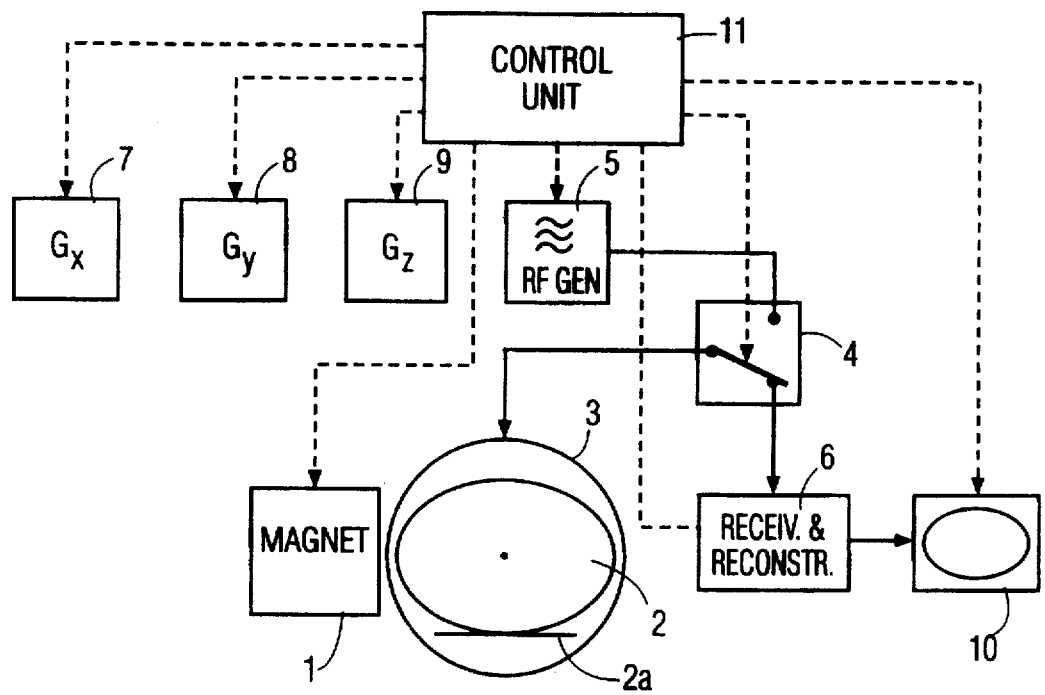
FIG. 1 shows a device for carrying out the method of the invention.

FIG. 1 shows diagrammatically a magnet 1 for generating a steady, uniform magnetic field in an examination region. A patient 2 to be examined is arranged on a table top 2a in the examination region. In addition to the steady magnetic field, a pulsed magnetic RF field generated by an RF coil 3 also acts on the examination region.

During the generation of this magnetic RF pulse, the RF coil 3 is connected to an RF generator 5 via a switch 4. The MR signals subsequently occurring in the examination region can be received by the same RF coil 3. The RF coil 3 is then connected to an MR receiver and reconstruction unit 6 via the switch 4. Instead of a single RF coil for generating the RF pulses and for receiving the MR signals as well as instead of the switch 4 which optionally connects this RF coil to the RF generator 5 or the MR receiver and reconstruction unit 6, two separate RF coils one can also be used for generating the RF pulses and one for receiving the MR signals.

Magnetic gradient field generated by means of gradient coil systems 7, 8 and 9 also act on the examination region. The magnetic gradient field extend in the same direction as the uniform, steady magnetic field generated by the magnet 1, but these magnetic fields have a gradient. The gradients of the magnetic fields generated by the gradient coil systems 7, 8, 9 are mutually perpendicular.

In the receiver and reconstruction unit 6 the MR signals, forming the modulation of an RF carrier, are demodulated and digitized. From the MR data thus obtained an image of the nuclear magnetization distribution in the examination region is reconstructed in the receiver and reconstruction unit 6, which image can be displayed by way of a monitor 10. The temporal cooperation of the units 3 . . . 10 is controlled by a preferably programmable control unit 11.

If during the reception of the MR signals used for the reconstruction, the control unit 11 varies two of the magnetic gradient fields, for example the magnetic gradient field $G_x$ and $G_y$ generated by the gradient coil systems 7 and 8, sinusoidally in timed while increasing or decreasing their amplitudes, the MR signals in the two-dimensional k-domain are sampled along spiral-like trajectories.

Figure 2A:
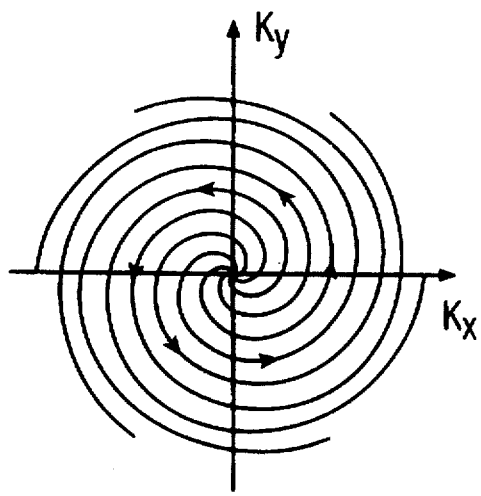
FIG. 2a shows the position of the spirals in the k-domain for a conventional MR examination.

FIG. 2a shows the resultant spiral pattern in the k-domain. The spiral pattern is composed of p (=6) spirals, each of which is shaped as an Archimedian spiral. The (temporal) variation of a spiral thus satisfies the equations $$k_x(t) = a|t|\cos(\omega t + \alpha) \tag{1}$$

and $$K_y(t) = a|t|\sin(\omega t + \alpha) \tag{2}$$

Therein, a is the slope of a spiral, indicating the distance between neighboring turns, $\omega$ is the angular velocity at which the k vector moves in the k-domain, and $\alpha$ denotes the starting angle, i.e. the angle with respect to the $k_x$-axis at which the spiral leaves the origin of the k-domain. t is a parameter, typically denoting time. The starting angles are uniformly distributed, resulting in the relation:

$$\alpha = \alpha_o + 2n\pi/p \; ; n = 1 \ldots p \tag{3}$$

All MR dam acquired during the described MR examination can be assigned to points in the k-domain which are uniformly distributed between the p spirals. The MR data which are read after one excitation of the nuclear magnetization in the examination region fall onto a single spiral. In order to form the spiral pattern consisting of p spirals as shown in FIG. 2a, therefore, p sequences are required, each of which comprises the excitation of the examination region by one or more RF pulses and the subsequent reading of the MR signals with a corresponding temporal variation of the magnetic gradient field $G_x$, $G_y$.

It is known that the relationship between the vector $G = (G_x, G_y)$ of the gradient magnetic field and the vector k $(= k_x, k_y)$ in the spatial frequency domain is given by:

$$G_x = \frac{1}{\gamma} \frac{dk_x}{dt} \text{ and } G_y = \frac{1}{\gamma} \frac{dk_y}{dt} \tag{4}$$

Therein, $\gamma/2\pi$ is the gyromagnetic constant (42.6 MHz/T for hydrogen) and $k_x$ and $k_y$ vary in time as according to equations (1) and (2), respectively. The resulting temporal variation of the magnetic gradient field and its integration in an MR sequence are given inter alia in the cited article by C. B. Ahn et al., notably in FIG. 1, which is specifically referred to herein.

Figure 2B:
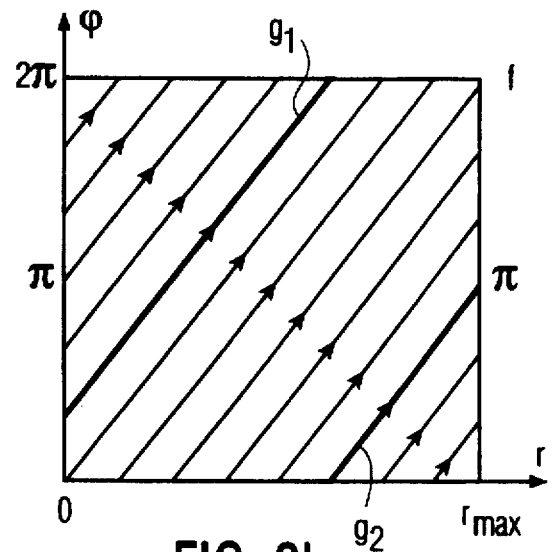
FIG. 2b shows an equivalent r,φ diagram.

FIG. 2b shows a diagram which is equivalent to FIG. 2a and which represents the polar coordinates r,$\phi$ of the spirals in the k-domain. In an Archimedian spiral a linear relationship exists between the angle $\phi$ made by the $K_x$-axis and a straight line connecting a point on this spiral to the origin of the k-domain and the length r of this straight line, so that a spiral in the k-domain becomes a straight line in the r,$\phi$ diagram. Because r($2\pi$) corresponds to the value r(0), a sawtooth-like transition occurs in this straight line at $\phi = 2\pi$. For example, the heavy line segments 91 and 92 correspond to a single spiral in the diagram of FIG. 2a. The p identical spirals with uniformly distributed starting angles in the R,$\phi$ diagram of FIG. 2b become p parallel straight lines which are offset by the same amount relative to one another in the $\phi$ direction.

The number of spirals p (6 in the example), the number of turns of each individual spiral (4/3 turns in the example) and the distance between the neighboring turns determine the spatial resolution in the MR image reconstructed from the MR data and also the size of the region imaged. For example, if the nuclear magnetization is to be reconstructed in a region comprising N×N pixels, the product of the number p of spirals and the number of turns must correspond to the value N and on each turn of a spiral an $\pi$N2 MR data must be acquired. When the size of the pixels is d, the radius of the k-domain covered by the spiral pattern must amount to $\pi/d$. In that case the factor a (see equation 1) there is obtained as a $= 2\pi p/(dN)$ and for $\omega$ is given by $\omega = \pi N/(pT)$, in which T is the measuring time per spiral.

It follows that the number of spirals or the number of turns of each individual spiral, is the larger the more pixels there are in an MR image of the examination region. The examination duration required to acquire the MR data necessary for the reconstruction of the nuclear magnetization distribution, however, increases as a function of the number of spirals, whereas the effect of inhomogeneities of the steady magnetic field generated by the magnet 1 on the image quality increases as a function of the number of turns or the measuring time T per spiral. Therefore, the invention aims to provide ways of enabling the reconstruction of an MR image by means of less spirals, or with shortened spirals, without reducing the spatial resolution of the MR image or the number of constituent pixels. To this end, the method in accordance with the invention to be described hereinafter utilizes the following facts:

$$k(t) = -k \left( t + \frac{\pi}{\omega} \right) ; k = (k_x, k_y); \tag{5}$$

a) two spirals having the same slope a but starting angles offset by $\pi$ or 180° are mirrored versions of one another, or:

b) in the ideal case, the MR data associated with two measuring points situated in a mirrored fashion relative to one another in the k-domain are complex conjugate. In practice, however, because of phase shifts deviations from this ideal behavior do occur. Generally speaking, however, such a phase shift varies only slightly within the MR image, so that for the higher spatial frequency components of such an image a constant phase shift may be assumed.

Therefore, when in accordance to the condition b) it is possible to derive the MR data for (auxiliary) points in the MR domain from the measured MR data associated with given points in the k-domain, it is not necessary to acquire measuring values for all points of the spiral pattern shown in FIG. 2a, because at least a part of the measuring values can be derived from the measured MR data. This will be described in detail hereinafter with reference to the FIGS. 3a and 3b.

Figure 3A:
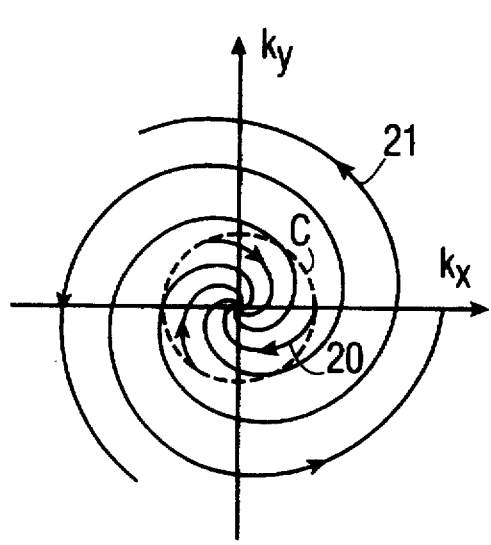
FIG. 3a shows the position of the spirals in the k-domain for a first embodiment of the invention.

The spirals in the k-domain according to FIG. 3a represent the trajectories along which the MR signals are sampled during an MR examination. Within the circle C around the origin of the spatial frequency domain, corresponding to the low spatial frequencies, the number and the position of the spirals is identical to FIG. 2a. Outside this circle, however, every second spiral is absent. In the associated r,φ diagram, in which the radius of the circle is denoted by the reference $r_c$, the omitted spirals (for $r > r_c$) are denoted by dashed lines. Because half the number of spirals is absent outside the circle C, the number of measured MR data available for the reconstruction is less than that in the case of the spiral pattern shown in FIG. 2a. Nevertheless, an MR image of an exactly equally large part of the examination region can be reconstructed from this reduced data set with the same spatial resolution as in FIG. 2a (be it with a lower signal-to-noise ratio.

The reduction of the MR data, however, is advantageous only if either the total number of spirals or the time required for acquiring the MR data on one spiral can be reduced. The individual spirals in the diagram, however, are not shorter than in FIG. 2a, and the number of spirals is not smaller than in FIG. 2a, at least not within the circle C. In order to achieve a reduced measuring time, the magnetic gradient field are varied during the reading in such a manner that in the k-domain first a spiral arm which extends from the edge of the center to its center is traversed, for example the spiral arm 20, and subsequently a spiral whose starting angle offset has been by 180°, i.e. the spiral 21. The starting angle is then shifted through 180°, but because at the center of the spatial frequency domain the time integral over the magnetic gradient fields has reached exactly the value zero, this does not mean an abrupt change of the magnetic gradient field. Thus, the reduced data set shown in FIG. 3 can be acquired by means of p/2(=3) excitations, so that the examination time is essentially halved.

The reconstruction of the nuclear magnetization distribution from the reduced data set of FIG. 3a and FIG. 3b will be described in detail hereinafter on the basis of the flow chart shown in FIG. 4. After acquisition of all MR data $S_{lo}(k)$ associated with the center of the spatial frequency domain, i.e. the low spatial frequencies, have been acquired and half the MR data $S_{hi}(k)$ have been acquired (block 100) (in accordance to FIG. 3b), first the phase shift of the RF spatial frequencies incurred during the acquisition of the MR data is calculated. In the absence of a phase shift, the MR data associated with mirrored points in the k-domain should be complex conjugate. If a phase shift β is present, it is to be calculated in the block 101 from the equation $$e^{2i\beta} = \frac{S_{lo}^*(k)}{S_{lo}(-k)} \quad ; k = (k_x, k_y) \tag{6}$$

Therein $S_{lo}^*(k)$ is an MR data, i.e. a digitized value, which is conjugate complex with the scanning value $S_{lo}(k)$ of the MR signal measured for the point $k=(k_x, k_y)$ in the k-domain. The reference $S_{lo}(k)$ denotes a measuring value which is associated with a mirrored point k should be situated at the edge of the circle C.

Figure 3B:
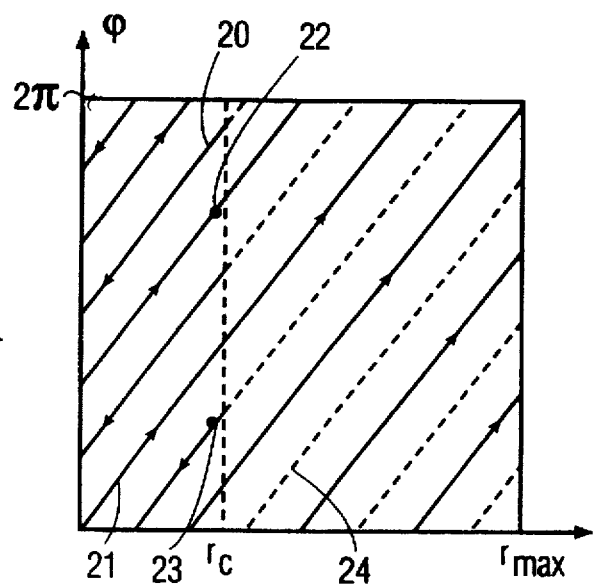
FIG. 3b shows the associated r,φ diagram.

In FIG. 3b two mirrored points in the circle C are denoted by the references 22 and 23. They have the same radius (i.e. the same distance from the zero point of the k-domain) and enclose angles relative to the $k_x$-axis which deviate by 180° or π. In order to avoid statistical fluctuations, it is advantageous to use the near value associated with a plurality of pairs of mirrored points.

During the next step (block 102), MR auxiliary data $S'_{hi}$ are calculated for (the higher spatial frequencies from the measured MR data $S_{hi}(k)$ in accordance to the equation:

$$S'_{hi}(-k) = e^{2i\beta} S_{hi}^*(k) \tag{7}$$

The data $S^*_{hi}(k)$ are then complex conjugate with the MR data on one of the spirals (for example, 21) outside the circle C. The data $S'_{hi}(-k)$ are associated with the spirals which are not shown in FIG. 3a and which are denoted by a dashed line in FIG. 3b, said spirals being situated in a mirrored fashion relative to the relevant spirals. In FIG. 3b these are the (dashed) spirals which have been shifted upwards or downwards by the distance π relative to the basic spiral. For example, the spiral 24 is the mirror-image of the spiral 21. Condition a) is utilized for this purpose.

After MR auxiliary data $S'_{hi}(-k)$ have thus been derived from the MR data $S_{hi}(k)$ for the spirals omitted outside the circle, which MR data have been measured for mirrored spirals a complete data set will be available for the reconstruction of the nuclear magnetization distribution. The reconstruction of the nuclear magnetization distribution s(x, y) in the block 103 is performed in accordance to the equation:

$$s(x,y) = F^{-1}[S_{lo}(k_x, k_y) + S_{hi}(k_x, k_y) + S'_{hi}(-k_x, -k_y)] \tag{8}$$

Therein, $F^{-1}\phi$ represents the inverse Fourier transform over the argument φ. This is preferably performed in accordance to the "gridding algorithm" described in an article by J. D. O'Sullivan in the journal IEEE Transactions on Medical Imaging, Vol. MI-4, No. 4, pp. 200–207, 1985.

For the embodiment described with reference to FIG. 3a it was assumed that outside the circle C every other spiral had been omitted in comparison with the complete spiral pattern. However, every other spiral need not necessarily be omitted. In the case of p spirals, the p/2 first or last spirals can also be omitted. It is only essential that there remains a group of p/2 spirals such that the difference between the starting angles α of two spirals of this group is always different from 180° or π.

Figure 4:
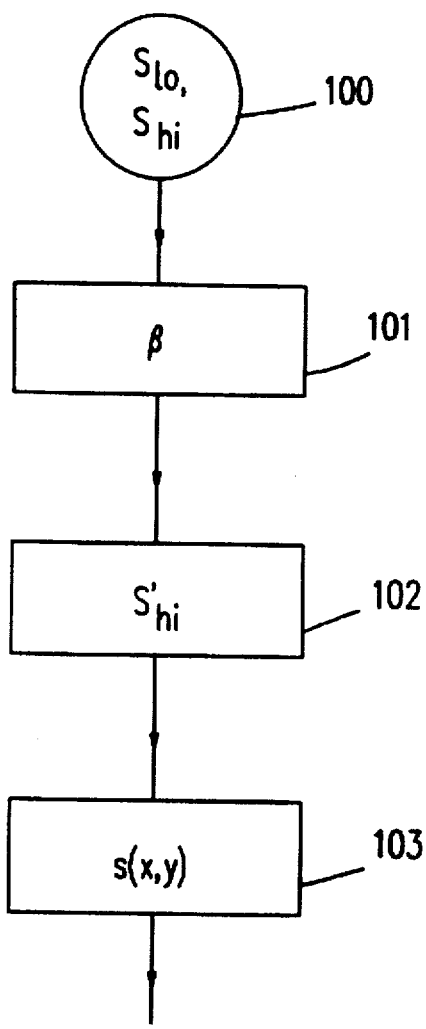
FIG. 4 shows a flow chart illustrating the method of the invention.

For the reconstruction in accordance with the flow chart shown in FIG. 4 it was assumed that the missing data on a spiral which has been omitted in comparison with FIG. 2a must be calculated from the MR data of a mirrored spiral, in accordance to the equation 7. However, this is not necessary in all cases. It is also possible to make all of these auxiliary data equal to zero and to perform a reconstruction. After a few further calculation steps a complex data set s'(x,y) can be obtained whose real component represents the desired MR distribution s(x,y).

Figure 5A:
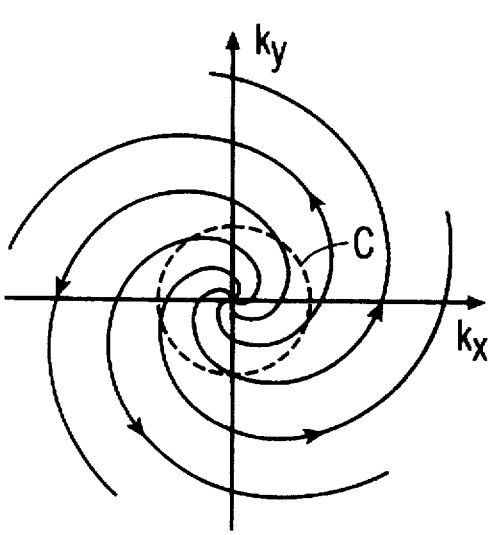
FIG. 5a shows the position of the spirals in the k-domain for a second embodiment of the invention.
Figure 5B:
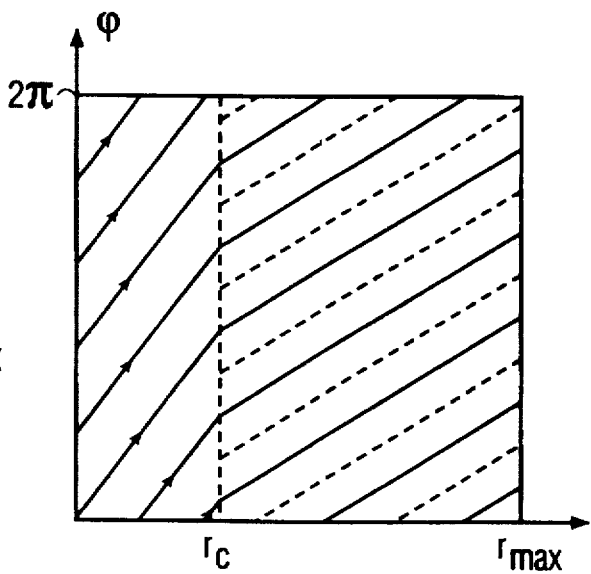
FIG. 5b shows the associated R,φ diagram.

The embodiment explained with reference to FIG. 3a was based on a spiral pattern comprising an even number p of spirals. FIGS. 5a, 5b, however, represent a possibility of acquiring a reduced MR data set wherefrom the nuclear magnetization distribution can be completely reconstructed in the case of an odd number of spirals (p=5). The number and the shape of the spirals in the circle C, corresponding to the low spatial frequencies, again corresponds to FIG. 2a. Outside the circle the number of spirals is maintained, but their slope, i.e. the value a in the equations (1) and (2) is doubled. The maximum spatial frequencies, therefore, are reached with fewer spiral turns than for the complete MR data set of FIG. 2a, i.e. the spirals are shortened. As a result the number or the spatial density of the data situated on the spirals outside the circle C decreases.

The associated variation in the r,φ diagram is given in FIG. 5b. The completion of this MR data set and the reconstruction of the nuclear magnetization from the completed data set can be performed in a manner similar to that described with reference to FIG. 4 for the embodiment of FIG. 3a. Thus, first the phase angle β is determined again in accordance to the equation 6 (block 101), after which the k-domain outside the circle C around the origin of the spatial frequency domain is complemented by MR auxiliary data $S'_{hi}$ (−k) derived from the measured MR data on the measured spirals (block 102). The MR auxiliary data $S'_{hi}$(−k) are associated with the spirals which are not shown in FIG. 5a and which are represented by dashed lines in FIG. 5b, said spirals being mirrored versions of the relevant spirals.

After such completion of the incomplete data set, an inverse Fourier transformation is performed in accordance to the equation 8 (block 103).

According to the method for reducing the MR data set as described with reference to FIG. 5a, the number of spirals is not reduced in comparison with FIG. 2a, but rather their length. This offers the advantage that the time elapsing between the excitation of the nuclear magnetization in the examination region by one or more RF pulses and the end of the read interval can be reduced. The MR data then acquired are less disturbed by the inhomogeneities of the magnetic field than MR data which are acquired completely in accordance to FIG. 2a.

In the method explained with reference to FIG. 5b the spirals exhibit a bend for $r=r_c$. In practice this bend should be rounded; for a given variation of k(t) the associated gradient variations can be calculated in accordance to equation (4).

For the foregoing embodiments it was assumed that the acquisition of the MR data on a single spiral also requires only a single excitation by one or more RF pulses and a subsequent reading of the MR data. Alternatively, it is possible to traverse a spiral by way of several successive excitation and read cycles. This offers the advantage that a part of the high spatial frequencies can also be measured without being disturbed by the inhomogeneity of the main magnetic field generated by the magnet 1 (FIG. 1). It is further to be noted that temporal dependencies other than those indicated in the equations (1) and (2) are also possible, for example dependencies without a constant angular velocity.

For the embodiments described thus far it was assumed that the nuclear magnetization distribution is to be determined exclusively in a two-dimensional, flat region, for example the x,y-plane. The invention, however, is also suitable for the three-dimensional determination of the three-dimensional nuclear magnetization distribution. A reduction of the MR data is especially important in this case because the measuring time required for acquiring the MR data can be substantially halved. A number of possibilities exist in this respect.

1. In accordance to a first possibility, the magnetic gradient fields are varied in time in such a manner that the MR data in the three-dimensional k-domain are acquired along flat Archimedian spirals, a group of one or more of which is respectively situated in one of a multitude of planes. These planes intersect in a straight line passing through the origin of the k-domain, i.e. the origin is situated at the center of each of these planes. Therefore, the data set required for complete coverage of the k-domain can be reduced by acquiring MR data on an incomplete spiral pattern for each of these planes and by complementing the missing MR auxiliary data for the high spatial frequencies as described for the two-dimensional case of the FIGS. 3–5.

Figure 6:
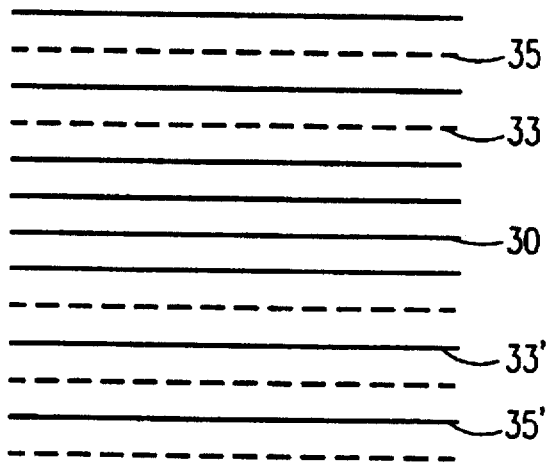
FIG. 6 shows the scanning planes in the k-domain for an embodiment which is suitable for three-dimensional data acquisition.

2. According to a second possibility, the k-domain can be scanned along parallel planes, each of which may be covered by a complete spiral pattern in accordance with FIG. 2a. However, it is not necessary to measure the MR data in all of these planes. This is illustrated in FIG. 6 which shows the position of the planes in the k-domain, the plane 30 containing the origin of the k-domain. The planes in the k-domain which are situated around this origin, i.e. the low spatial frequencies, must be completely scanned. This is not necessary for the planes which are situated further from the zero point and which are associated with the high spatial frequencies. For example, as is indicated in FIG. 6, the third plane 33 and the fifth plane 35 above the central plane 30 can be omitted and the MR data associated with these planes can be reconstructed from the MR data of the mirrored planes 33' and 35', it being assumed that, ignoring the phase shift β, mirrored points (on the planes 33 or 33') have complex conjugate MR data.

However, it is also possible to vary the magnetic gradient fields in such a manner that the planes outside the center of the k-domain are covered by an incomplete spiral pattern, for example as shown in FIG. 3a, when the incomplete spiral pattern in one of these planes, for example 35, can be complemented by mirroring the spiral pattern in the mirrored plane (35').

A reconstruction from the resulting reduced MR data set can be performed in the same way as described with reference to FIG. 4: first the phase shift is determined for the completely acquired MR data which are situated in the k-domain in the vicinity of the origin and symmetrically with respect to the central plane 30 (block 101). Subsequently, for the planes (for example, 33 and 35) which are associated with the high spatial frequencies and for which no MR data have been derived, MR auxiliary data are derived from the MR data of the mirrored planes (33' and 35'), in order to complement the incomplete MR data set (block 102). Finally, the three-dimensional nuclear magnetization distribution s(x,y,z) in the examination region is determined from the complemented data set by inverse Fourier transformation.

3. The two foregoing possibilities are based on flat, i.e. two-dimensional spirals. However, it is also possible to acquire the MR data along three-dimensional spirals, notably spirals situated on a surface of a cone whose vertex is situated at the origin of the k-domain. The term "spiral" in the context of the invention, therefore, is to be broadly interpreted. Assuming that the axis of the surface of the cone extends in the z-direction of the k-domain, the equations (1) and (2) and the additional equation $$k_z = b|t| \tag{9}$$

hold for the spirals situated on the surface of the cone, b being a constant. The temporal variation of the magnetic gradient fields $G_x$, $G_y$ and $G_z$, required for this purpose is derived from the temporal derivation from $k_x$, $k_y$ and $k_z$ in analogy with the equation (4). $G_z$ is thus constant.

In order to enable the scanning of a three-dimensional domain, a family of such conical surfaces, covered by spirals, is required, these conical surfaces should have the same cone axis but different (positive and negative) angles and they should terminate on a spherical surface around the origin of the k-domain. Analogously to the two-dimensional case, outside a sphere about the origin of the k-domain which is associated with the low spatial frequencies, every other conical surface, and hence the associated MR measurement, can be dispensed with when the mirrored conical surface relative to the origin is retained. Instead, however, all surfaces of cone can be retained and the spirals situated thereon outside said sphere can be reduced if a mirrored spiral exists on the mirrored conical surface.

The reconstruction of the nuclear magnetization distribution can then be performed as described with reference to the FIGS. 3–5: for the missing conical surfaces of cone or the missing spirals, MR auxiliary data $S'_{hi}(-k)$ are derived from the MR data $S_{hi}(k)$ ($k =(k_x,k_y,k_z)$) associated with the mirrored conical surfaces. The MR data set thus complemented is subjected to an inverse Fourier transformation.

I claim:

1. An MR method for determining a spatial distribution of nuclear magnetization in an examination region, comprising:

a) exciting nuclear magnetization in the examination region one or more times by applying at least one RF pulse in the presence of a steady, uniform magnetic field;

b) reading MR signals produced after the excitation in order to acquire MR data for points in a spatial frequency domain, magnetic gradient fields acting on the examination region being applied during the reading;

c) varying these magnetic gradient fields in such a manner that the MR signals are read while traversing the spatial frequency domain along one or more spirals, a density of the spirals or their turns in a central part of the spatial frequency domain being greater than that outside the central part; and d) reconstructing a nuclear magnetization distribution for the examination region from a data set which comprises the acquired MR data and derived MR auxiliary data for points outside the central part on mirror-images of the one or more spirals, MR data not having been acquired by traversing the mirror-images outside the central part.

2. An MR method as claimed in claim 1, wherein the excitation of nuclear magnetization and the reading of the MR signals are repeated p/2 times, p being an even integer number of at least 2, and that a temporal variation of the magnetic gradient field is varied from one repetition to another in such a manner that said one or more spirals comprise:

a) a first group of p spirals having starting angles offset 360°/p relative to one another, said first group of spirals extending between an edge of the central part of the spatial frequency domain and its center, and b) a second group of p/2 spirals which extend outward from the edge of the central part, and that after excitation, two spirals of the first group whose starting angles are offset 180° with respect to each other and a spiral of the second group are successively traversed.

3. An MR method as claimed in claim 2, wherein p/2 is an odd integer number and the spirals of the second group extend outward from respective points where every other spiral of the first group meet the edge of the central part.

4. An MR method as claimed in claim 1, wherein the magnetic gradient fields are varied in such a manner that the spirals in the spatial frequency domain extend beyond the central part, their slope outside the central part amounting to twice their slope inside the central part.

5. An MR method as claimed in claim 1, wherein the plurality of spirals are always traversed in segments by way of several successive excitation and read cycles.

6. An MR method as claimed in claim 1, wherein for three-dimensional determination of the nuclear magnetization distribution in the examination region the magnetic gradient fields are varied in such a manner that the MR signals are read while traversing the spatial frequency domain along spirals which are situated in mutually parallel planes.

7. An MR method as claimed in claim 6, wherein the planes in a central part of the three-dimensional spatial frequency domain have a density which suffices for complete reconstruction, and the planes situated outside the central part and mirror images of these planes together have a density which corresponds to the density of the planes in the central part.

8. An MR method as claimed in claim 1, wherein for three-dimensional determination of the nuclear magnetization distribution in the examination region the temporal variation of the magnetic gradient fields are varied in such a manner that the MR signals are read while traversing the spatial frequency domain along spirals which are situated in a family of planes which intersect one another in a straight line passing through the origin of the spatial frequency domain.

9. An MR method as claimed in claim 1, wherein for three-dimensional determination of the nuclear magnetization distribution in the examination region the magnetic gradient fields are varied in such a manner that MR signals are read while traversing the spatial frequency domain along spirals which are situated on coaxial, conical surfaces with different apex angles, a part of the conical surfaces being omitted outside a central part around the origin of the spatial frequency domain in such a manner that the remaining conical surfaces, together with their mirror-images relative to the origin, have a density which suffices for the reconstruction.

10. An MR device for determining a spatial distribution of nuclear magnetization in an examination region, comprising:

a) a magnet for generating a steady, uniform magnetic field in the examination region, b) an RF coil system for transmitting magnetic RF pulses or for receiving MR signals, c) gradient coil systems for generating magnetic gradient fields which extend in the direction of the steady, uniform magnetic field and which comprise gradients extending in three mutually perpendicular directions, d) receiver and reconstruction means for converting the MR signals into a series of MR data and for reconstructing the nuclear magnetization distribution in the examination region from the MR data, e) control means for controlling the items a) to e), which control means controls a temporal variation of currents through the gradient coil systems in such a manner that MR data for points in a spatial frequency domain is acquired by reading MR signals produced while traversing one or more spirals in the spatial frequency domain, a density of the spirals, or their turns, in a central part of the spatial frequency domain amounting to at least twice a density outside the central part the spatial frequency domain, and f) reconstruction means for reconstructing a nuclear magnetization distribution for the examination region from a data set which comprises the acquired MR data and derived MR auxiliary data for points outside the central part on mirror-images of the one or more spirals, MR data not being acquired by traversing the mirror-images outside the central part.

\* \* \* \* \*